United States Patent
Castiglione et al.

(10) Patent No.: US 11,415,612 B2
(45) Date of Patent: Aug. 16, 2022

(54) COMPLEX DIELECTRIC SENSOR

(71) Applicant: METER Group, Inc. USA, Pullman, WA (US)

(72) Inventors: Paolo Castiglione, Pullman, WA (US); Gaylon S. Campbell, Pullman, WA (US)

(73) Assignee: METER GROUP, INC. USA, Pullman, WA (US)

( * ) Notice: Subject to any disclaimer, the term of this patent is extended or adjusted under 35 U.S.C. 154(b) by 226 days.

(21) Appl. No.: 16/596,547

(22) Filed: Oct. 8, 2019

(65) Prior Publication Data
US 2021/0105008 A1  Apr. 8, 2021

(51) Int. Cl.
| G01N 27/02 | (2006.01) |
| G01R 27/26 | (2006.01) |
| G01N 27/22 | (2006.01) |
| G01N 27/04 | (2006.01) |

(52) U.S. Cl.
CPC ....... *G01R 27/2617* (2013.01); *G01N 27/028* (2013.01); *G01N 27/221* (2013.01); *G01N 27/223* (2013.01); *G01N 27/228* (2013.01); *G01N 27/048* (2013.01)

(58) Field of Classification Search
CPC .. G01N 27/028; G01N 27/228; G01N 27/223; G01N 27/048; G01N 27/221; G01R 27/2617
See application file for complete search history.

(56) References Cited

U.S. PATENT DOCUMENTS

| 4,502,006 | A | * | 2/1985 | Goodwin | B60G 17/01933 |
| | | | | | 180/167 |
| 5,479,104 | A | | 12/1995 | Cambell | |
| 5,859,536 | A | * | 1/1999 | Stockton | G01N 27/223 |
| | | | | | 324/664 |
| 6,239,601 | B1 | * | 5/2001 | Weinstein | B64D 15/20 |
| | | | | | 324/649 |
| 6,904,789 | B2 | | 6/2005 | Campbell et al. | |
| 7,408,364 | B1 | * | 8/2008 | Campbell | G01N 33/246 |
| | | | | | 324/644 |

(Continued)

OTHER PUBLICATIONS

Callegaro, L., 2009. The metrology of electrical impedance at high frequency: a review. Meas. Sci. Technol. 20, 022002.

(Continued)

*Primary Examiner* — Jeff W Natalini
(74) *Attorney, Agent, or Firm* — Dorsey & Whitney LLP

(57) ABSTRACT

A complex dielectric sensor includes at least two voltage dividers to measure voltage amplitudes in a circuit of at least two impedances connected to a transducer probe. The impedances are configured to reduce amplification of raw error using relatively simple geometric calculations based on mapping the voltage amplitudes as a pair of intersecting circles in a complex admittance space. Instrument sensitivity can be optimized by selecting impedances with moduli in the complex admittance space that are similar in magnitude to the modulus of the sample admittance and by selecting impedances that cause characteristic directions of the voltage dividers (relative to the sample admittance in the complex admittance space) to be oriented as close to perpendicular to each other as possible.

12 Claims, 17 Drawing Sheets

(56) References Cited

U.S. PATENT DOCUMENTS

| | | | |
|---|---|---|---|
| 7,535,237 B1* | 5/2009 | Campbell | G01N 27/223 |
| | | | 324/644 |
| 7,944,220 B2 | 5/2011 | Lock | |
| 10,191,184 B2* | 1/2019 | Anjum | G01W 1/02 |
| 2010/0253369 A1* | 10/2010 | Izadnegahdar | G01N 27/223 |
| | | | 324/664 |
| 2019/0157901 A1* | 5/2019 | Tamai | H02M 7/48 |

OTHER PUBLICATIONS

Callegaro et al., 2003. Precision Impedance Measurements by the Three-Voltage Method with a Novel High-Stability Multiphase DDS Generator. IEEE Transactions on Instrumentation and Measurement, vol. 52, No. 4, pp. 1195-1199.

Kremer et al., 2002. Broadband Dielectric Measurement Techniques (10-6 Hz to 1012 Hz). Broadband Dielectric Spectroscopy. Springer, Berlin., Chapter 2, pp. 35-57.

Marzetta, L.A., 1972. An Evaluation of the Three-Voltmeter Method for AC Power Measurement. IEEE Transactions on Instrumentation and Measurement, vol. 21, pp. 353-357.

Muciek et al., 2006. Analysis of a Three-Voltmeter Measurement Method Designed for Low Frequency Impedance Comparisons. Metrology and Measurement Systems 13, 19-31.

Overney et al., 2018. Impedance Bridges: From Wheatstone to Josephson. Metrologia 55, Pages S119-S134.

Callegaro et al., 2004. Numerical uncertainty evaluation for complex-valued quantities: a case example, Advanced Mathematical and Computational Tools in Metrology VI. Presented at the Advanced Mathematical and Computational Tools in Metrology VI, World Scientific Publishing Co. Pte. Ltd, pp. 274-278.

* cited by examiner

=

+

_US 11,415,612 B2_

COMPLEX DIELECTRIC SENSOR

TECHNICAL FIELD

The present disclosure generally relates to sensors and equipment for measuring properties of soil, food, and other porous media.

BACKGROUND

In the field of precision agriculture and plant cultivation, on-site measurements of soil properties are used to monitor and manage plant health and growth conditions. Dielectric permittivity and electrical conductivity of the soil or other porous media are among the different measurements used in this manner. Measuring those properties can provide information about the water and nutrient content of the soil so that growers can manage proper watering, fertilization, and other activities affecting plant growth. Other industries, including for example the food and beverage industry, also use these measurements to determine and control production conditions, transportation conditions, shelf life, and other properties of their products.

The volume fraction of water in porous media such as soil is strongly correlated to its dielectric permittivity. Salinity, on the other hand, strongly affects the electrical conductivity. Permittivity and conductivity can be estimated at once by measuring the complex admittance of the sample. Such measurements typically involve sophisticated and expensive electronics and are not suited for field applications. As a consequence, the vast majority of moisture sensors available on the market measure only permittivity. When conductivity measurements are also featured, they are obtained through a distinct circuit. Although those measurements are simple and convenient, they typically have poor accuracy. In particular, sample conductivity typically has a negative impact on dielectric measurements, and existing technologies are known to perform satisfactorily as long as soil salinity is low or moderate.

Some soil moisture sensors perform complex dielectric measurements, i.e., measurements of both permittivity and conductivity. As opposed to traditional (and expensive) techniques for measuring complex impedance, these sensors are based on the so called "Three Voltmeter Method" (TVM), which relies on voltage amplitude measurements. The TVM was originally developed for power measurements in electronics, and its use in impedance metrology is limited to a few laboratory applications. The TVM is not more widespread in spite of its convenience because it notoriously suffers from low sensitivity issues. As a result, accuracy may be unsatisfactory for some values of the sample dielectric or conductivity. When such issues are not addressed, the TVM often results in poorly performing instruments. Furthermore, there is no general method for evaluating the sensitivity of a TVM sensor, and the theory underlying it is incomplete at least in part due to the complexity of the algebra involved. There is therefore a need for constant improvements to the design, implementation, and analysis of dielectric sensors.

SUMMARY

Aspects of the present disclosure relate to a complex dielectric sensor for porous media, comprising a voltage source to output a signal having a frequency and an amplitude, at least two electrodes insertable into a sample medium, a first impedance electrically connected between the signal source and the electrodes, a second impedance electrically connected between the signal source and the electrodes, a first junction located between the first impedance and the second impedance, a second junction located between the second impedance and the at least one electrode of the at least two electrodes, and a sensor device to measure a first amplitude of the first signal at the first junction and to measure a second amplitude at a second signal second junction, wherein at least one of the first and second impedances comprises a reactive circuit element.

In some embodiments, the first impedance comprises a capacitor and the second impedance comprises a resistor or an inductor. The first impedance can comprise a resistor and the second impedance can comprise a capacitor or an inductor. The first impedance can comprise an inductor and the second impedance can comprise a resistor or a capacitor. The first and second impedances can be connected in series. The signal source, the first impedance, the second impedance, and the electrodes can form a three-wire half bridge configuration.

In some embodiments, the sensor can further comprise a switch configured to selectively and independently apply the signal to the first impedance or the second impedance. The first and second impedances can be connected in parallel.

Another aspect of the disclosure relates to a sensor for measuring complex dielectric properties of a sample material, wherein the sensor comprises at least two electrodes insertable into a sample material, a signal generator to excite the electrodes through a circuit, with the circuit having a first impedance element, a second impedance element, a first node positioned between the first and second impedance elements, and a second node positioned between the second impedance element and the electrodes, a first voltmeter to measure a first voltage amplitude of the signal at the first node, and a second voltmeter to measure a second voltage amplitude of the signal at the second node. A dielectric permittivity of the sample material and a conductivity of the sample material are determinable using the first and second voltage amplitudes, wherein the first and second impedance elements have electrical characteristics causing absolute error in the determined dielectric permittivity of the sample material to be less than 15 units per millivolt of voltmeter error when the sample material has a dielectric permittivity within a range of 1-81 relative dielectric units, and wherein the first and second impedance elements have electrical characteristics causing absolute error in the determined conductivity of the sample material to be less than 0.25 decisiemens per meter per millivolt of voltmeter error when the sample material has a conductivity within a range of 0 to 5 dS/m.

In some embodiments, the absolute error in the calculated dielectric permittivity of the sample material is less than 2 units per millivolt of voltmeter error and the absolute error in the calculated conductivity of the sample material is less than 0.10 dS/m per millivolt of voltmeter error. At least one of the first and second impedance elements can comprise reactive electrical characteristics. The signal generator, the first impedance element, the second impedance element, and the electrodes can form a three-wire half bridge.

Yet another aspect of the disclosure relates to a method of manufacturing a complex dielectric sensor. The method can include constructing a circuit by connecting a first impedance element and a second impedance element to a set of electrodes, with the set of electrodes being positionable within a porous medium, connecting a voltmeter to the circuit to measure a first voltage amplitude between the first impedance element and the set of electrodes, with the first voltage amplitude having a first characteristic direction falling on a plot of values in a complex admittance space, and connecting the voltmeter to the circuit to measure a second voltage amplitude between the second impedance element and the set of electrodes, with the second voltage having a second characteristic direction falling on the plot of values in the complex admittance space. In some embodiments, an angle between the first and second characteristic directions in the complex admittance space is always greater than zero.

In some embodiments, the angle between the first and second characteristic directions lies within a range extending from about 20 degrees to about 160 degrees. The first voltage amplitude can be representable by a first circle falling on the plot, with the first circle having a first center point having a first modulus, and the second voltage amplitude can be representable by a second circle falling on the plot, with the second circle having a second center point having a second modulus. The first and second moduli can be substantially equal.

Constructing the circuit can further comprise selecting the first and second impedances such that for a porous medium having a relative dielectric permittivity within a range of 1-81 units and having a conductivity within a range of 0-5 decisiemens per meter: an absolute error in measuring a dielectric permittivity of the porous medium is less than 15 per millivolt of voltmeter error, and an absolute error in measuring conductivity of the porous medium is less than 0.25 dS/m per millivolt of voltmeter error.

Still another aspect of the disclosure relates to a method of manufacturing a complex dielectric sensor, with the method comprising: constructing a circuit by connecting a first impedance element and a second impedance element to a set of electrodes, with the set of electrodes being positionable within a porous medium; connecting a voltmeter to the circuit to measure a first voltage amplitude between the first impedance element and the set of electrodes, with the first voltage amplitude being representable by a first circle falling on a plot of values in a complex admittance space and with the first circle having a first modulus; and connecting the voltmeter to the circuit to measure a second voltage amplitude between the second impedance element and the set of electrodes, with the second voltage amplitude being representable by a second circle falling on the plot and with the second circle having a second modulus. The first and second moduli can be substantially equal.

The first and second circles can have respective first and second characteristic directions, and an angle between the characteristic directions can be always greater than zero for the porous medium. The porous medium can have a sample admittance having a third modulus, with the third modulus being substantially equal to the first and second moduli. At least one of the first and second impedance elements can be a reactive circuit element.

BRIEF DESCRIPTION OF THE DRAWINGS

The accompanying drawings and figures illustrate a number of exemplary embodiments and are part of the specification. Together with the present description, these drawings demonstrate and explain various principles of this disclosure. A further understanding of the nature and advantages of the present invention may be realized by reference to the following drawings. In the appended figures, similar components or features may have the same reference label.

Figure 1:
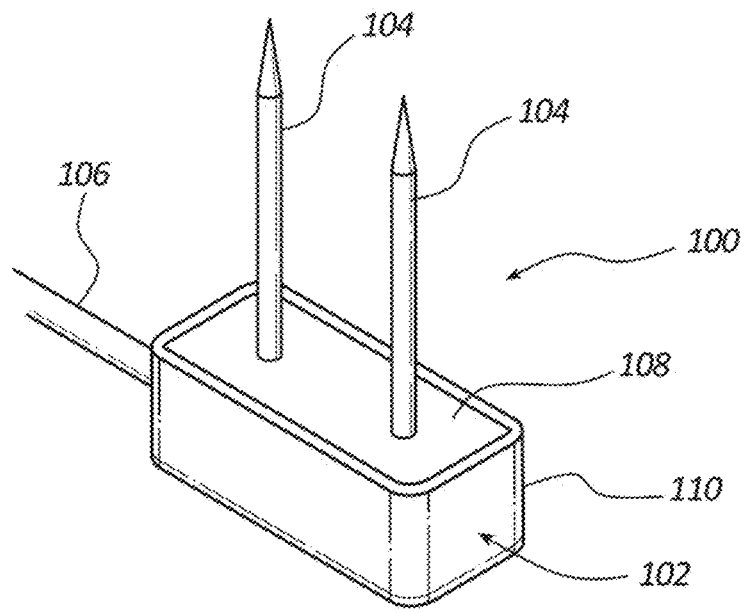
FIG. 1 is a perspective view of a complex dielectric sensor.

While the embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION

The present description provides examples, and is not limiting of the scope, applicability, or configuration set forth in the claims. Thus, it will be understood that changes may be made in the function and arrangement of elements discussed without departing from the spirit and scope of the disclosure, and various embodiments may omit, substitute, or add other procedures or components as appropriate. For instance, the methods described may be performed in an order different from that described, and various steps may be added, omitted, or combined. Also, features described with respect to certain embodiments may be combined in other embodiments.

Aspects of the present disclosure relate to methods for calculating the sample complex admittance from measurements of three voltage amplitudes. Various embodiments can be based on simple geometrical considerations and have general validity, i.e. they apply to any Three Voltmeter Method (TVM) device. Moreover, analysis of a system using these methods offers an intuitive interpretation of the error propagation mechanisms from raw to final measurements underlying sensitivity and permits designing simple and accurate dielectric sensors whose performance can be readily tested. These sensors represent a considerable improvement over existing designs.

One aspect of the present disclosure relates to a complex dielectric sensor for porous media, i.e., one that can simultaneously measure the dielectric permittivity and the electrical conductivity of the sample material. Such a sensor can use voltage amplitude measurements at three nodes in a circuit to estimate the complex sample admittance. In particular, the circuit comprises a sinusoidal voltage oscillator that is connected to two electronic components in series with the sample. The sample is made of two or more electrodes surrounded by the material under test. Proper selection of the two components in series with the sample can have a strong effect on the sensitivity and performance of the sensor.

The device can be regarded as a dual voltage divider, and each voltage divider can operate along a characteristic direction. The mutual orientation of these two directions can determine the accuracy of a given dielectric measurement device. When these two directions are nearly perpendicular, the instrument can display optimized sensitivity to the measurand and can therefore have optimized accuracy. When this criterion is not met, as in some existing products, sensitivity can be low in some or all parts of the sample domain, and the resulting sensor can suffer from insufficient accuracy. Thus, aspects of the present disclosure relate to a method of analysis of a sensor and sensors meeting criteria suggested by use of the method of analysis that represent a significant advancement in the field of complex dielectric measurements.

The dielectric permittivity ($\varepsilon$) of porous media, such as soil or food, is strongly dependent on moisture, or water content ($\theta$). This is because water displays very high value of $\varepsilon$ (about 78 at room temperature) relative to that of other components (e.g., $\varepsilon=1$ for air and about 4 for solid minerals). As a result, water content can be inferred from measurement of the dielectric permittivity of the sample material. Due to the presence of salt, soil and other porous materials are typically conductive. Electrical conductivity ($\sigma$) is also of great interest in agricultural or food industry, as the salinity of the water phase can be inferred from it. Most commercially available sensors perform measurements of both $\varepsilon$ and $\sigma$, although through two distinct circuits.

A complex dielectric sensor can be optimized by analysis of geometrical relationships between the properties of the component parts thereof, whereby sample admittance values compatible with the first voltage amplitude ratio describe a first circle in the complex admittance space, and sample admittance values compatible with the second voltage amplitude ratio describe a second circle in the admittance space. For any given sample admittance, the location of the centers of the two circles determines the accuracy of the sensor. In particular, the greatest accuracy is attained when the distances of the two centers from the origin is comparable in magnitude to the modulus of the sample admittance, and when the angle formed by the two segments connecting each center to the sample admittance is close to 90 degrees.

Figure 2:
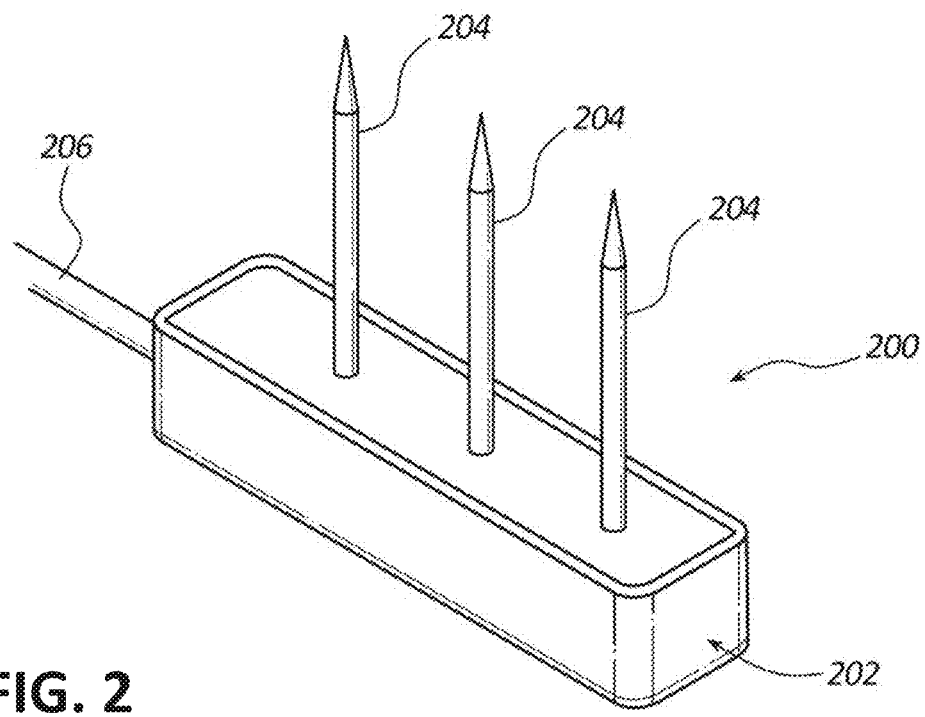
FIG. 2 is a perspective view of another complex dielectric sensor.

Soil moisture sensors are intended for field use and continuous monitoring. The sample is therefore open to mass and energy flow, with electrodes typically arranged as in the examples in FIGS. 1 and 2. FIGS. 1 and 2 are isometric views of sensor devices of the present disclosure. In FIG. 1, the sensor device 100 comprises a housing 102, a pair of probes 104, and a cable 106. Similarly, the sensor device 200 of FIG. 2 comprises a housing 202, three probes 204, and a cable 206. The devices 100, 200 are configured for insertion of the probes 104, 204 into porous media to obtain a measurement of the permittivity and conductance of the material.

The housings 102, 202 can comprise an insulating, waterproof material that contains and protects a circuit (e.g., a circuit board within the housing 102). In some embodiments, the housings 102, 202 protect the probes 104, 204 without housing a circuit, and the circuit is connected to the probes 104, 204 via the cables 106, 206. As shown in FIG. 1, a housing 102 can include a base 108 and a cap 110 that can fit tightly over the base 108. The cable 106 can extend through the cap 110 and can provide electrical communication between electrical components within the housing 102 and electrical components external to the housing 102. Thus, the housings 102, 202 can protect the sensor devices 100, 200 from moisture and damage while being used to probe soil and other materials. The cables 106, 206 can provide a connection between the probes 104, 204 and meters, recording equipment, and power sources used in connection with the sensor devices 100, 200.

The probes 104, 204 can comprise two or more conductive tines, spikes, slats, or similar features which form a capacitor insertable into a sample material. The probes 104, 204 can be electrodes and can comprise conductive metal (e.g., stainless steel) or other conductive materials. At least one of the probes 104, 204 can be electrically insulated from at least one of the other probes 104, 204 within the housing 102, 202. It will be appreciated that any number of probes 104, 204 can be similarly disposed on the housings 102, 202 to form the outer surrounding capacitor surface which is inserted into the material. For example, three outer or peripheral tines can be equally or equidistantly disposed around a central tine.

Figure 3A:
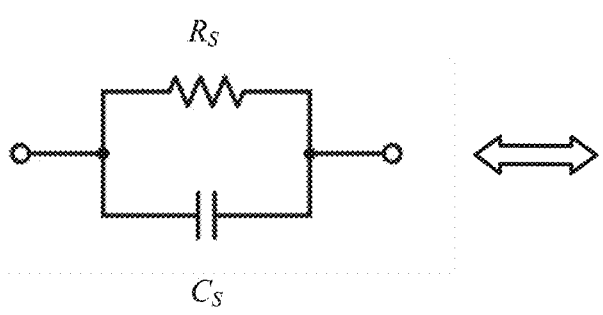
FIG. 3A is a circuit diagram representing a sample material.
Figure 3B:
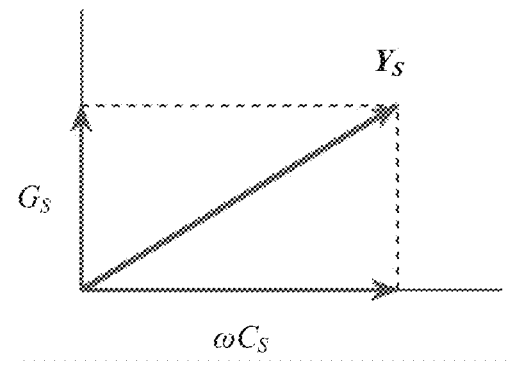
FIG. 3B is a diagram illustrating a relationship between admittance, conductance, and dielectric of the sample material.

A pair of electrodes 104/204 kept at different potential (voltage) forms a capacitor. The capacitance of the sample is proportional to the dielectric property of the material in between. In other words, $C_S = C_0 \varepsilon$, where the constant $C_0$ is determined by the geometry of the electrodes. For electrically conductive materials, the sample also displays a conductance $G_S$ (also expressed as a resistance, wherein resistance $R_S = 1/G_S$) acting in parallel with $C_S$, as shown in FIG. 3A. $G_S$ depends on geometry and conductivity of the sample material using this relationship: $G_S = C_0 \sigma / \varepsilon_0$. For sinusoidal excitation, the electric response of the sample is determined by its admittance $Y_S$ (which is the reciprocal of the impedance, $Z_S$), which is in this case:

$$Y_S = G_S + i\omega C_S \quad (1)$$

where $\omega$ is the angular frequency. $Y_S$ is a complex number, and as such it can be represented as a point, or vector, on a 2D space, as shown in FIG. 3B. The components of such vector, $\omega C_S$ and $G_S$, are respectively proportional to $\varepsilon$ and $\sigma$. Measuring complex admittance therefore leads to simultaneous measurements of permittivity and conductivity. The two quantities can be combined to form the complex dielectric permittivity using this relationship:

$$\varepsilon = \varepsilon - i\frac{\sigma}{\omega \varepsilon_0}. \quad (2)$$

A single capacitor filled with such material displays the same admittance as in equation (1). Therefore, complex admittance (or impedance) or complex dielectric measurements can be referred to equivalently. As used in the present disclosure, complex quantities are indicated with bold fonts. Scalars, such as the modulus of a complex quantity (e.g., the amplitude of voltage phasors), are indicated with normal font.

Figure 4:
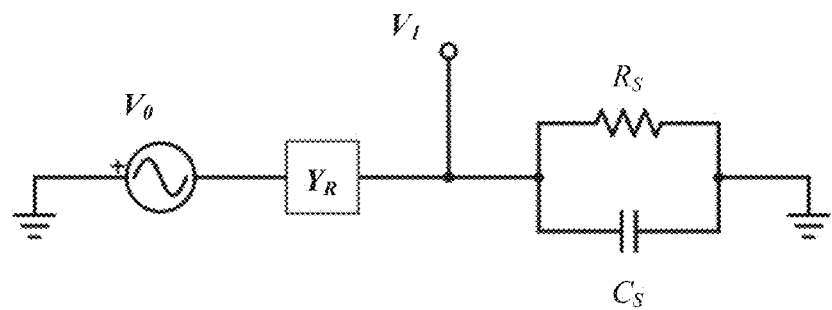
FIG. 4 is a circuit diagram of a sensor apparatus.

To measure the impedance of a device, the current through and the voltage across of the device must be gauged. Due to I-V conversion, the current and voltage across the device can be determined by measuring two voltages. The most basic device to convert current into voltage is the voltage divider (VD), or half bridge, depicted in FIG. 4. Here, a generic reference component of admittance $Y_R$ is connected in series with the sample ($Y_S$, represented by $R_S$ and $C_S$). Using elementary network analysis one can determine:

$$\frac{V_1}{V_0} = \frac{Y_R}{Y_R + Y_S}. \quad (3)$$

Some traditional techniques (e.g., the impedance bridge) generally attempt to measure complex $V_1$ and $V_0$ (i.e., their amplitude and phase) using phasor voltmeters. Assuming $Y_R$ known, $Y_S$ is then estimated from the complex gain ratio $V_1/V_0$.

Unlike phasor voltmeters, scalar or root mean square (RMS) voltmeters measure only amplitude. The latter are typically less expensive and more accurate than the former, so may offer an attractive alternative to phasor measurements. Obviously, from a scalar measurement it is not possible to obtain a complex quantity. However, according to embodiments of the present disclosure, $Y_S$ can be estimated from two scalar measurements obtained, for example, from two independent voltage dividers. Since it takes three amplitude measurements to obtain two independent ratios, this technique is sometimes referred to as the three voltmeter method. However, this is not always possible. In other words, not all pairs of voltage dividers (VD) can be successfully employed to measure complex $Y_S$. Certain configurations display low or no sensitivity to the measurand. In those cases, small errors in raw measurements result into large uncertainty in $Y_S$, thus preventing accurate estimates. Consequently, the ability to identify and address low sensitivity issues can be central to the successful application of the three voltmeter method. Aspects of the present disclosure relate to a method that permits to assess the sensitivity of any dual voltage divider configuration. The analysis also permits to identify simple criteria for maximizing the performance of a given instrument, and eventually leads to optimal design for a complex dielectric sensor based on amplitude measurements.

Figure 5:
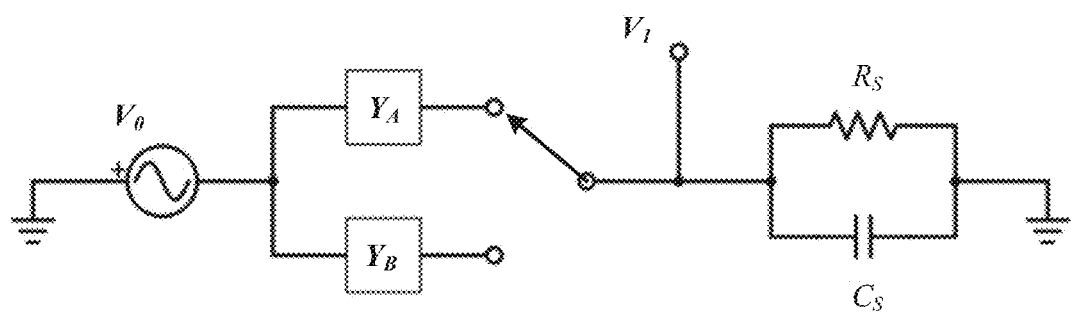
FIG. 5 is a circuit diagram of a complex dielectric sensor.
Figure 6A:
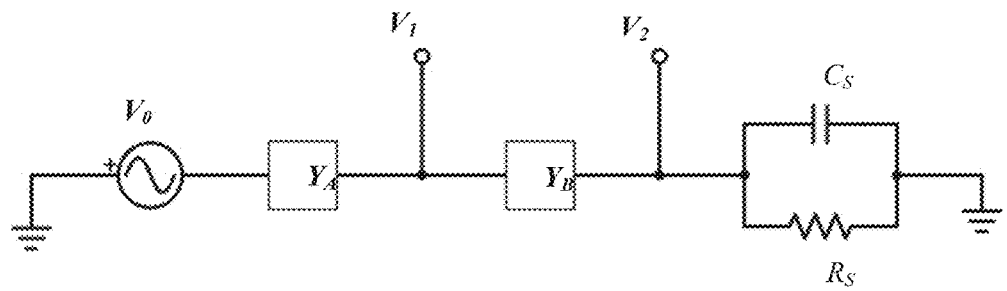
FIGS. 6A-6C are circuit diagrams of a complex dielectric sensor.
Figure 6B:
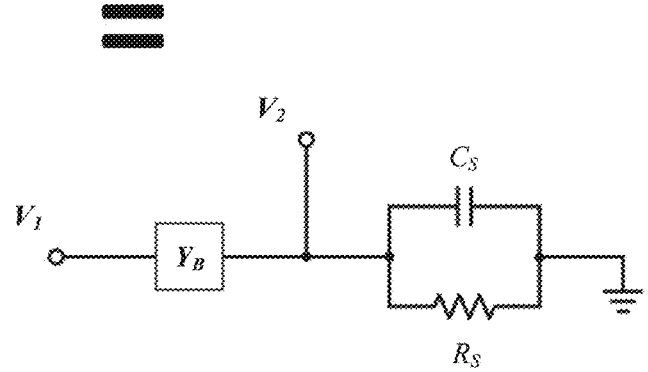
Figure 6C:
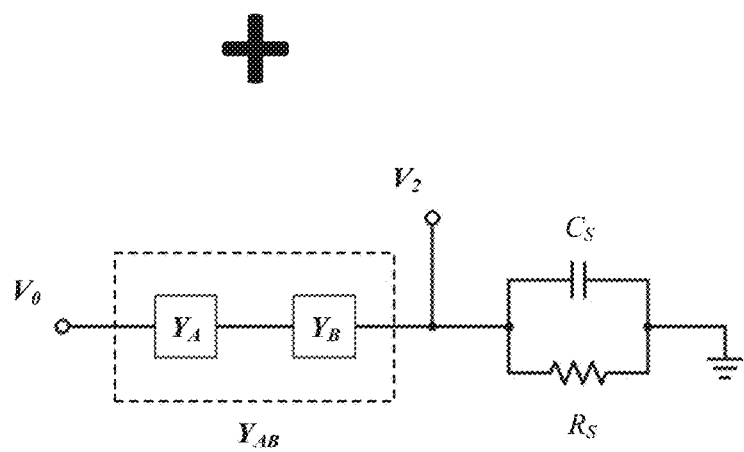

FIGS. 5 and 6 illustrate two possible embodiments of a dual voltage divider. In FIG. 5, a switch connects the sample to either $Y_A$ or $Y_B$, thereby effectively combining operation of two independent voltage dividers. The configuration in FIG. 6A includes three elements in series: $Y_A$, $Y_B$ and $Y_S$. Here, two voltage dividers can be identified from ratios $V_2/V_1$ and $V_2/V_0$. As illustrated, the first voltage divider evaluates the sample relative to component $Y_B$ (as suggested by FIG. 6B), while the second voltage divider evaluates relative to the series combination of $Y_A$ and $Y_B$, whose admittance is indicated as $Y_{AB}$ (see FIG. 6C). The configuration in FIG. 6 can be more convenient than the embodiment of FIG. 5, for it does not rely on active components such as switches. The results of the design analysis methods set forth below are general to both embodiments, however, and the results can be applicable to any possible configuration realizing a dual scalar voltage divider. Moreover, the analysis is not concerned with the functioning of the rms voltmeters, and the results remain valid regardless of the method chosen to measure voltage amplitude (e.g., by using linear or log rms detector, peak detectors, etc.). The voltages $V_1$, $V_2$ can be measured using a sensor device. The sensor device can comprise at least one voltmeter configured to measure the voltage at the indicated nodes in FIG. 6A. In some embodiments, the sensor device can comprise a set of voltmeters (e.g., a first voltmeter for measuring $V_1$ and a second voltmeter for measuring $V_2$).

Applying the voltage divider equation (3) above to each of the two scalar voltage dividers in FIGS. 6B and 6C, and taking the modulus of both sides, we obtain:

$$g_{21} = \frac{V_2}{V_1} = \left| \frac{Y_B}{Y_B + Y_S} \right| \quad (4)$$

$$g_{20} = \frac{V_2}{V_0} = \left| \frac{Y_{AB}}{Y_{AB} + Y_S} \right| \quad (5)$$

where gain ratios are indicated with $g_{ij}$. Equations (4) and (5) form a system of two scalar equations with one complex unknown $Y_S$ (equivalent to two scalar unknowns $\omega C_S$ and $G_S$). Accordingly, some embodiments of the disclosure relate to an application of calculating $Y_S$ from knowledge of $Y_B$ and $Y_{AB}$ and of gain ratios $g_{21}$ and $g_{20}$. Upon determining $Y_S$, complex dielectric measurements can be performed for a sample material.

Aspects of the present disclosure relate to implementing a complex dielectric sensor device and related methods based on resolution of equations 4 and 5. Analysis of conventional TVM devices involves complicated formulas that offer little insight on the effect of the different components. Furthermore, these solutions are valid only for ideal circuits, free from parasitic effects from components such as voltage detectors. When such effects are included in the analysis, the resulting equations may be hard to solve with the tools of algebra or even symbolic solver tools (e.g., MATLAB(R) SYMBOLIC TOOLBOX(R)). Moreover, the resulting expressions are so complicated, that would be of little use with micro controller-based instruments, and unfit to perform sensitivity analyses.

Accordingly, an aspect of the present disclosure relates to an approach for estimating $Y_S$, based on the following observation. For any $Y_B$ and $g_{21}$ values, the $Y_S$ points solutions of the equation (4) describe a circle in the admittance space. See FIG. 7A. Likewise, $Y_S$ points satisfying equation (5) describe a circle in the same space, determined by $Y_{AB}$ and $g_{20}$. See FIG. 7A. As a consequence, the solution to the system can be found from the intersection of the two circles, for this is where both scalar equations are satisfied. This result derives from properties of the complex relationship (3) between $V_1$ and $Y_S$ (from which equations (4) and (5) are derived). In complex analysis, this relation is referred to as linear fractional transformation (or Möbius transformation). Accordingly, circles in the $V_1$ plane map into circles in the $Y_S$ plane and vice versa (hence the mapping is called conformal). Phasors with constant amplitude describe a circle in the voltage space, therefore the corresponding $Y_S$ points must lie on a circle in the admittance space.

The method thus can comprise identifying two circles, each associated to a separate voltage divider (e.g., those indicated in FIGS. 5 and 6), and calculating $Y_S$ from the intersection of the circles. Centers (O) and radii (r) of the circles can be estimated from known circuit components and observed amplitudes. From equations (4) and (5), it can be shown that:

$$O_{21} = -Y_B \quad r_{21} = \frac{Y_B}{g_{21}} \tag{6}$$

and $$O_{20} = -Y_{AB} \quad r_{20} = \frac{Y_{AB}}{g_{20}}. \tag{7}$$

Figure 7A:
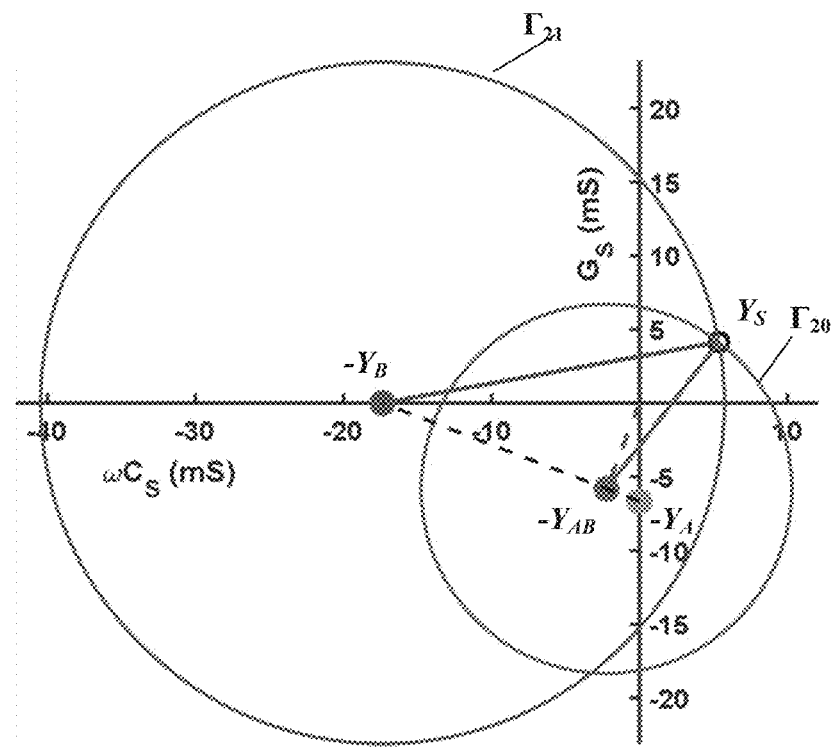
FIG. 7A is a plot of a complex admittance space showing example data based on the sensor circuit of FIG. 7B.
Figure 7B:
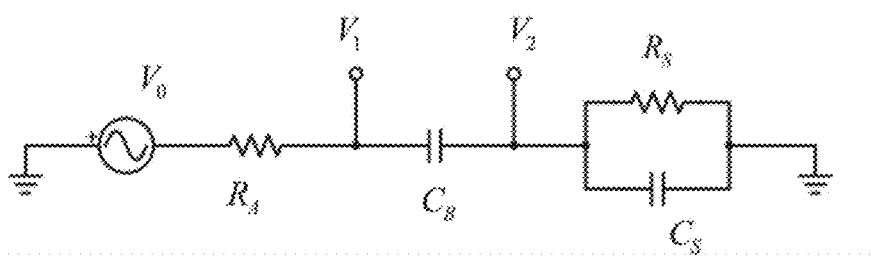
FIG. 7B is a circuit diagram of a sensor.

See FIG. 7A. The two centers depend on circuit components only, and therefore characterize a given instrument, whereas the radii vary with the sample through the scalar gain ratios. The method is exemplified in FIG. 7A for a generic RCS configuration (shown in FIG. 7B). The admittance of a resistor is a real number, while that of a capacitor is imaginary, so in this case $-Y_A$ and $-Y_B$ will lay respectively on the vertical and horizontal axes in FIG. 7A. The admittance space in FIG. 7A displays the imaginary part on the horizontal axis and the real part on the vertical axis. The admittance of their series combination, $-Y_{AB}$, is readily calculated and the corresponding point is located on a line connecting $-Y_A$ and $-Y_B$. Once the two centers are found, the gain ratios can be calculated from measured amplitudes, then the radii through equations (6) and (7). The resulting circles, indicated respectively as $\Gamma_{21}$ and $\Gamma_{20}$, intersect precisely at the sought sample admittance, which therefore is readily estimated. See FIG. 7A.

Figure 8A:
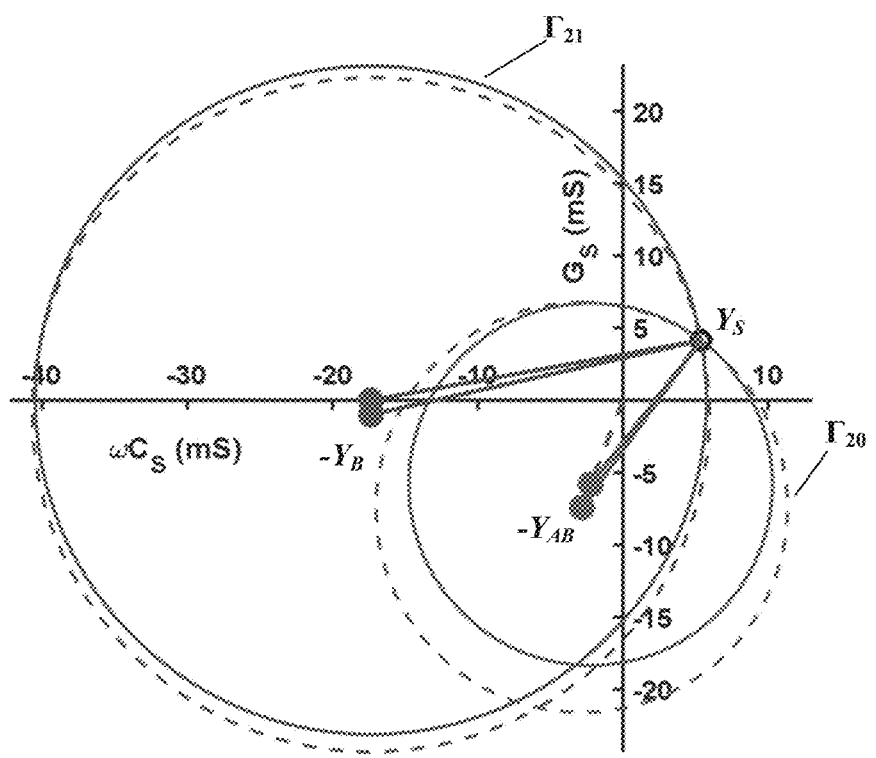
FIG. 8A is a plot of a complex admittance space showing example data based on the sensor circuit of FIG. 8B.
Figure 8B:
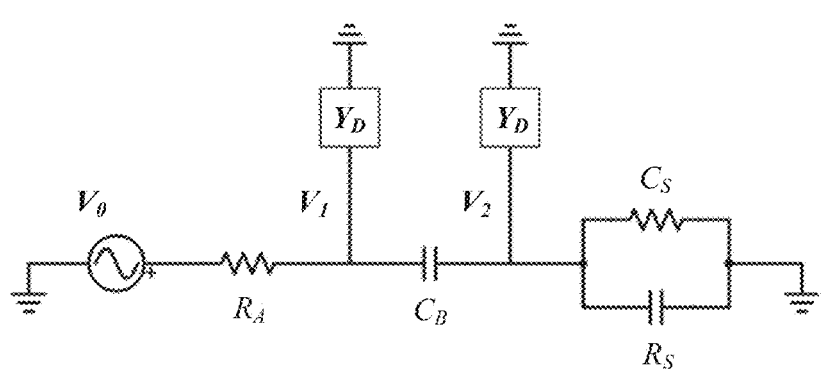
FIG. 8B is a circuit diagram of a sensor.

The proposed geometric method enables one to estimate $Y_S$ without formally solving the system of equations (4) and (5). The simplicity of this approach contrasts with the complexity of the solutions obtained through algebra. Unlike algebraic or computational solutions, equations (6) and (7) are general, and hold for any $Y_A$ and $Y_B$ composing the dual voltage divider in FIG. 6. Furthermore, parasitic effects are beneficially accounted for with this approach. For example, non-ideal voltage detectors (i.e., displaying non-negligible admittance, $Y_D$, as shown in FIG. 8B) may affect voltage amplitudes and alter the circuit's behavior. In the admittance space, this amounts to a slight displacement of the two centers and a corresponding variation in the radii, as illustrated in FIG. 8A. In this case, the circle analysis is shown in the figure with ideal (solid lines) and high admittance (broken lines) voltage detectors. The displacement of the centers $Y_A$, $Y_B$ is relatively significant, and so is the difference in the circles. However, the two pairs of circles intersect in the same point, which is the uncorrupted estimate of sample admittance. Modelling such effects is elementary, and for a dual voltage divider with non-ideal detectors, equations (6) and (7) can be replaced by equivalent expressions shown below.

$$O_{21} = -Y_B - Y_D \quad r_{21} = \frac{Y_B}{g_{21}} \tag{8}$$

$$O_{20} = -Y_Y - Y_D \quad r_{20} = \frac{Y_X}{g_{20}} \tag{9}$$

where:

$$Y_X = \frac{Y_A Y_B}{Y_A + Y_B + Y_D} \quad Y_Y = \frac{(Y_A + Y_D)Y_B}{Y_A + Y_B + Y_D} \tag{10}$$

Due at least in part to its simplicity and general validity, the proposed geometrical method represents a powerful tool in the analysis, design, and implementation of three voltmeter method instruments.

A sensitivity analysis of these instruments can evaluate the impact that errors in raw measurements or variations in components' electrical characteristics have on final estimates of dielectric and conductivity. Following the traditional algebraic approach, once an analytical solution to the specific three voltmeter method problem is obtained, the analysis typically proceeds with differentiating the resulting expressions for $C_S$ and $G_S$ with respect to all other variables and identifying the configuration that minimizes the final errors. As observed, the analysis is in general tedious, and sometimes analytical solutions are not available. In those cases, one may resort to numerical methods, such as Monte Carlo simulations, to assess the sensitivity of a given instrument. In all cases, the traditional approach rarely offers sufficient insight on how individual components or measurements may affect accuracy, and is therefore of limited value in sensor design. However, the geometrical methods of the present disclosure effectively help to assess the sensitivity of any dual voltage divider. The effects of error propagation from raw to final measurements can be made immediately apparent from the geometric circle analysis, and therefore simple criteria can be identified to maximize accuracy of a dielectric measurement instrument.

Figure 9:
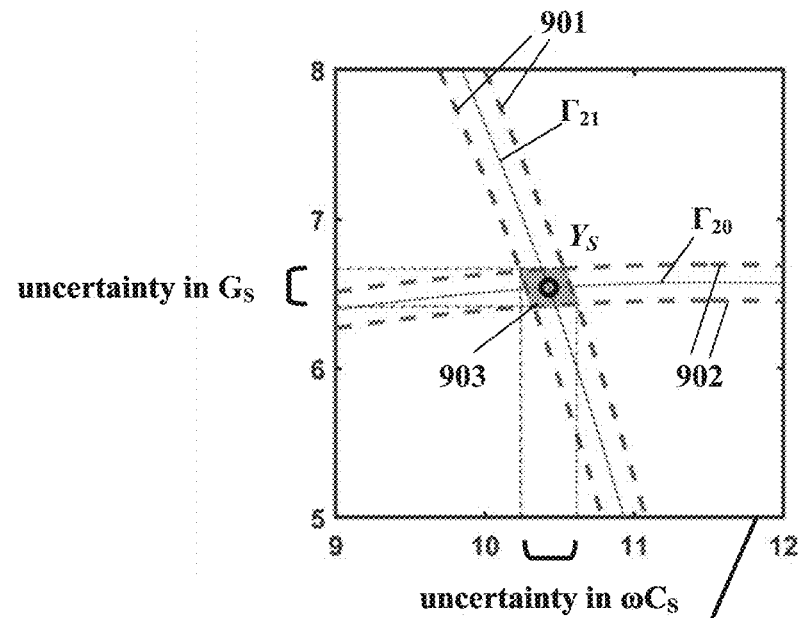
FIG. 9 is a plot of a complex admittance space showing example data based on a sensor circuit and a detail view indicating uncertainty in measurement values of a sample admittance.
Figure 9:
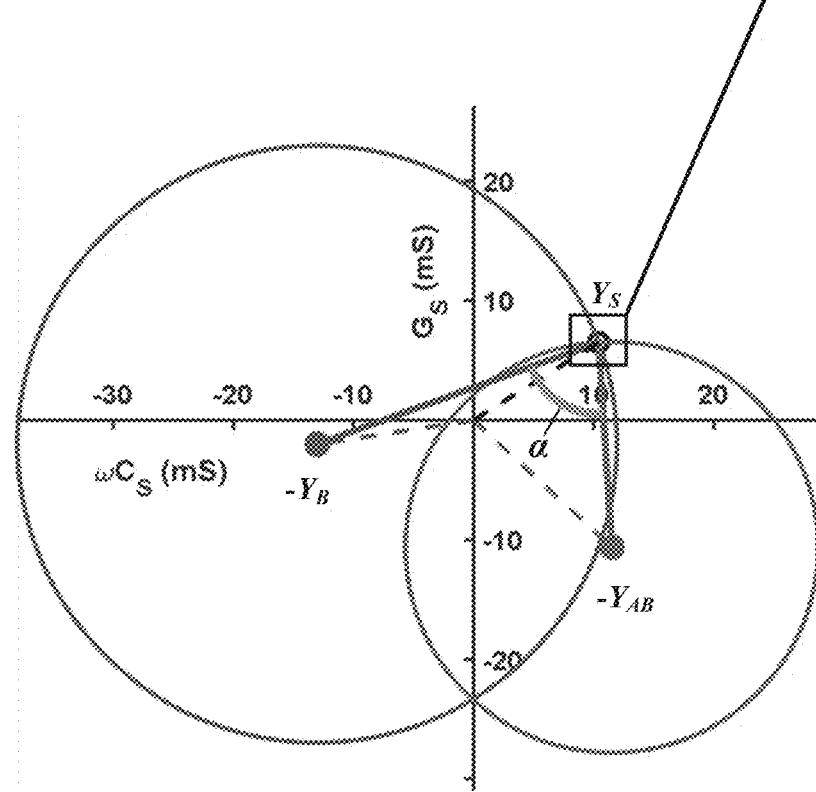

The geometric method can include estimating centers and radii for the two circles. As observed, the centers depend on circuit components only, so their exact location can be known (e.g., through calibration). Radii are determined by amplitude measurements, and are therefore subject to random error from noisy voltmeters. As a result, the accuracy of a three voltmeter method device is essentially determined by how errors in amplitude measurements impact the radii of the circles (and eventually the final estimates of dielectric and conductivity). The effects of this observation are illustrated in FIG. 9, wherein a hypothetical measurement of sample $Y_S$ is carried out through a generic dual voltage divider. Circles with continuous lines correspond to error-free estimates of the radii. As shown in the inset of FIG. 9, those circles intersect at the correct value of sample admittance. Due to radii errors, however, estimated circles could be anywhere between two extrema indicated with broken line curves (901 and 902). Rather than by lines, therefore, circles $\Gamma_{21}$ and $\Gamma_{20}$ are represented by bands of finite thickness (i.e., within the regions bounded by curves 901 and 902). The intersection of the two bands describes a finite region 903 in the admittance space representing the uncertainty in the exact location of $Y_S$. The projection of this region 903 on the horizontal axis (i.e., its maximum horizontal width) indicates an expected range of errors in $\omega C_S$ for a given error in the radii. Likewise, the projection of region 903 on the vertical axis (i.e., its maximum vertical width) represents the uncertainty in $G_S$ measurements. A user or sensor designer can therefore design a configuration for the dual voltage divider and components' values in a way that minimizes those error ranges.

As shown in FIG. 9, errors in $\omega C_S$ and $G_S$ are proportional to the thickness of the two bands. For each voltage divider, the thickness of the bands represents the radius error (dr) due to a given error in the corresponding gain ratio (dg). The value of dr can be calculated by differentiating either equation (4) or (5) with respect to g. For a generic voltage divider:

$$dr = -\frac{|Y_R + Y_S|^2}{|Y_R|}dg = -\lambda_r dg \qquad (11)$$

where $Y_R$ is a generic reference component, representing either $Y_B$ or $Y_{AB}$, respectively for circles $\Gamma_{21}$ or $\Gamma_{20}$. The proportionality coefficient $\lambda_r$ can be regarded as an amplification factor between the raw error dg and the error in radius estimate dr. It is easy to verify that $\lambda_r$ tends to infinite for both very large and very small $Y_R$. Consequently, an optimum $Y_R$ exists in between, wherein $\lambda_r$ attains a minimum. For any fixed direction, $\lambda_r$ is minimized when the modulus of the vector $Y_R$ is substantially equal to the modulus of the sample admittance $Y_S$.

Figure 10:
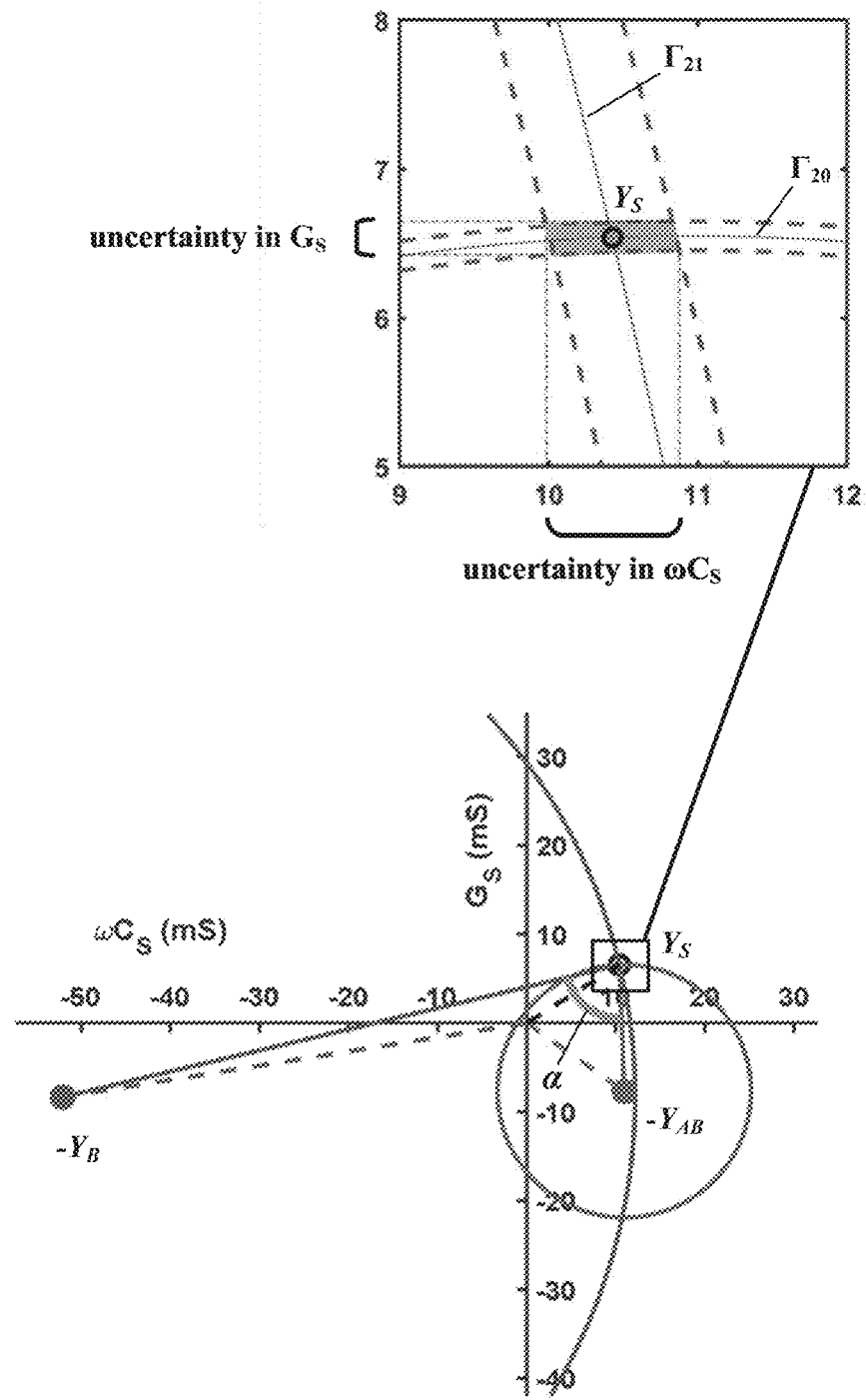
FIG. 10 is a plot of a complex admittance space showing example data based on a sensor circuit and a detail view indicating uncertainty in measurement values of a sample admittance.

FIG. 10 illustrates the amplification mechanism with an example. Here the vectors $-Y_{AB}$ and $Y_S$ (indicated by dashed lines to their respective circle center points) have similar moduli. As a result, the corresponding $\lambda_r$ is small (as provided by equation 11), and the uncertainty in radius of circle $\Gamma_{20}$ is small. On the other hand, the modulus of vector $Y_B$ is much larger than that of $Y_S$. Therefore, the same error in raw gain has a much larger impact on radius, as shown in the inset.

The well-functioning of each voltage divider individually does not guarantee accurate measurements in a dual voltage divider system. To that end, a scalar voltage divider has no sensitivity to small changes in $Y_S$ along a tangent to its circle in the admittance space (since, by definition, gain is constant on the circle). On the other hand, a voltage divider can have maximum sensitivity in the perpendicular direction, along the radius of its circle. The radial direction is therefore a "characteristic direction" of the voltage divider. The "characteristic direction," as used herein, refers to the line connecting the center of the circle to the measured sample admittance point. Examples of such connecting lines (i.e., the characteristic directions) are shown in FIG. 10.

A first voltage divider's decreased sensitivity in a direction tangent to its circle can be compensated by a second voltage divider, provided the second voltage divider displays non-zero sensitivity along said direction. Hence, two voltage dividers with parallel characteristic directions can have limited effectiveness because they do not complement each other (note the equivalency to an algebraic system formed by two interdependent equations). A measure of how effectively two voltage dividers combine together is therefore given by the angle ($\alpha$ in FIG. 10) between the two characteristic directions (i.e., the angle between the two circles' radii at the point $Y_S$). When angle $\alpha$ is zero or 180 degrees, both voltage dividers have identical characteristic directions and therefore the dual voltage divider is insensitive to changes in the sample admittance that are tangent to their circles (i.e., perpendicular to their characteristic directions). In either of these cases, the two centers and the sample admittance lie on the same line. In this case, the dual voltage divider has no sensitivity on the direction perpendicular to this line and complex dielectric measurements are not possible. Using embodiments and principles described herein, a skillful designer can choose and implement the two impedances in such a way that this scenario is never met due to the electrical characteristics (e.g., resistance, capacitance, and inductance) of the impedances.

Figure 11:
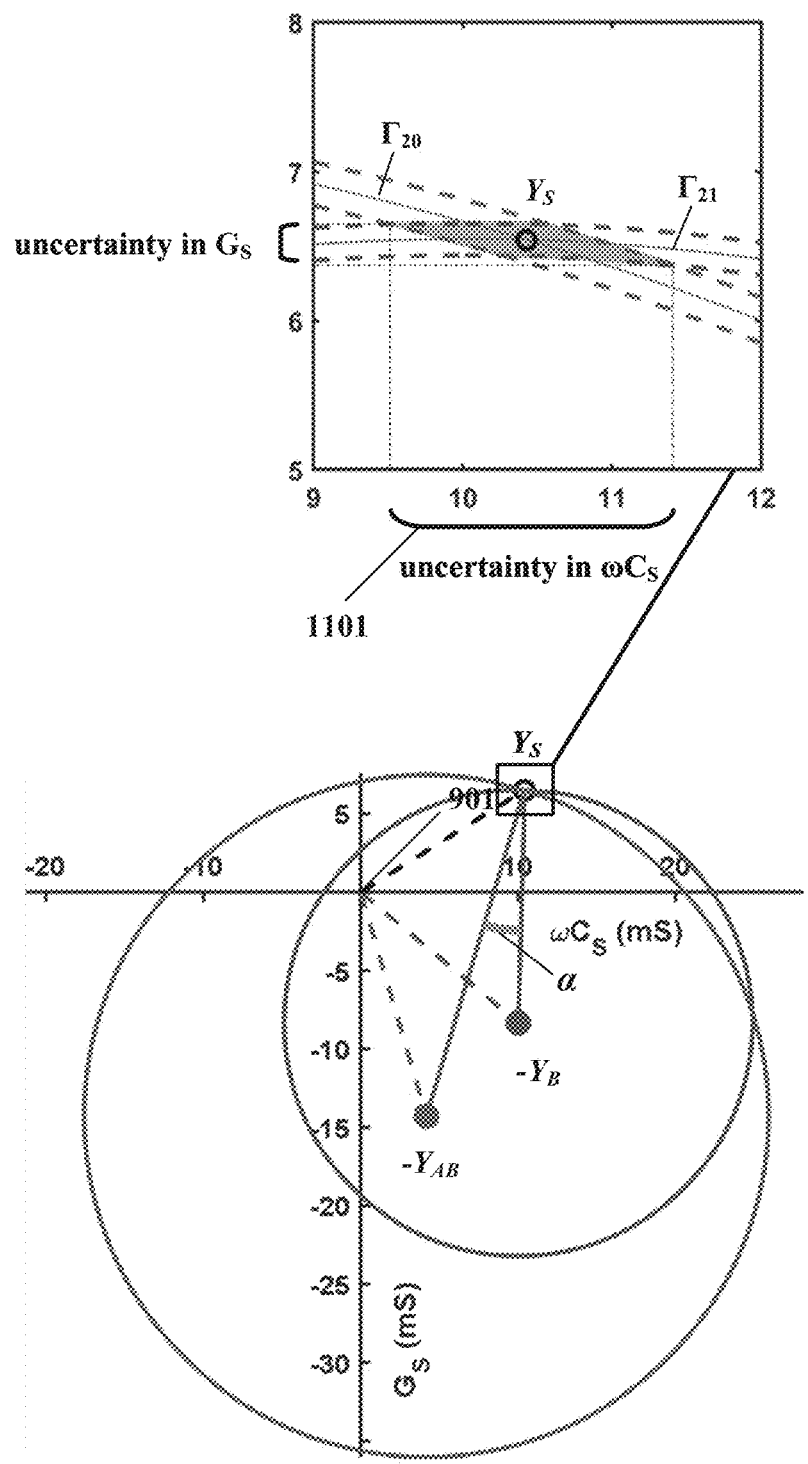
FIG. 11 is a plot of a complex admittance space showing example data based on a sensor circuit and a detail view indicating uncertainty in measurement values of a sample admittance.

FIG. 11 shows a plot of an example dual voltage divider with similar characteristic directions to illustrate the impact that $\alpha$ has on overall performance. Each individual voltage divider displayed has good sensitivity (i.e., each center has approximately same modulus as $Y_S$, and $\lambda_r$ is minimized), so the thickness of each of the corresponding bands is small. However, unlike the previous examples in FIGS. 9 and 10, the angle $\alpha$ between the characteristic directions is much smaller than 90 degrees, as shown in FIG. 11. As a result, the two circles and the characteristic directions (connecting their centers to the sample admittance $Y_S$) are closer to parallel as compared to the examples of FIGS. 9 and 10. The inset of FIG. 11 therefore shows that the intersection of the two bands covers a relatively large, elongated region which projects across an extensive interval on the horizontal axis (as indicated by the uncertainty 1101 in $\omega C_S$). Therefore, the instrument has suboptimal performance in measuring $\omega C_S$.

The error can be minimized when the characteristic directions of the two voltage dividers are substantially perpendicular (i.e., $\alpha=\pi/2$). In that case, a first voltage divider (e.g., $-Y_B$) has its insensitive direction (i.e., the direction tangent to its characteristic direction) aligned with the sensitive direction of the second voltage divider (e.g., $-Y_{AB}$), and vice versa. Geometrically, this means the overlapping bands of the circles has minimized horizontal and vertical dimensions (as shown in FIGS. 9 and 10).

Figure 12A:
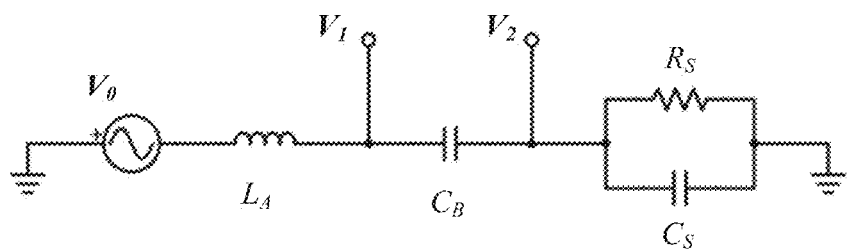
FIG. 12A is a circuit diagram of a sensor.
Figure 12B:
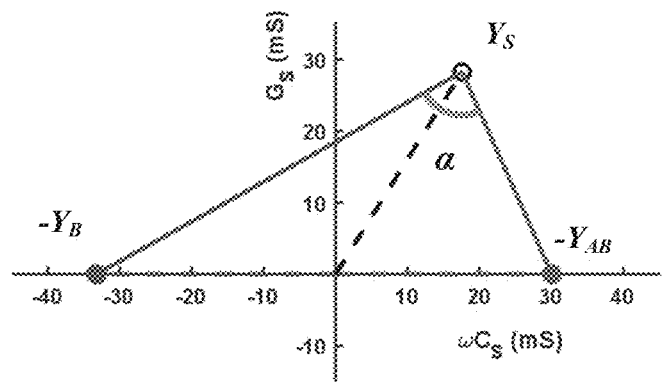
FIG. 12B is a plot of a complex admittance space showing example data based on the sensor of FIG. 12A.

In some embodiments, optimized accuracy (i.e., smallest errors in dielectric and conductivity values resulting from a given error in amplitude measurements) can be obtained when $\lambda_r$ is minimized (i.e., the moduli are substantially equal) and angle $\alpha$ is brought as close to 90 degrees as possible (i.e., the characteristic directions are substantially perpendicular). An example of such optimized performance is illustrated in FIG. 12A, showing a dual voltage divider configuration wherein an inductor and a capacitor are in series with the sample (i.e., an LCS configuration). When inductors and capacitors are properly dimensioned (i.e., such that the moduli are equal, and $Y_B=Y_{AB}=Y_S$), the points $Y_S$, $Y_{AB}$ and $Y_B$ can form a rectangular triangle (i.e., a right triangle with $\alpha=\pi/2$), as illustrated in FIG. 12B. For passive three-element circuits, it is possible to demonstrate that such configuration is unique. Thus, an optimum sensor configuration for this sample can be attained through relatively simple geometrical considerations and without complex computer calculations.

Figure 13A:
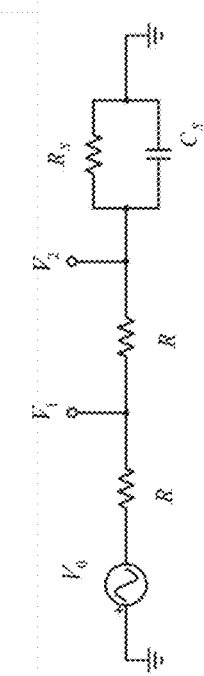
FIG. 13A is a circuit diagram of a sensor.
Figure 13B:
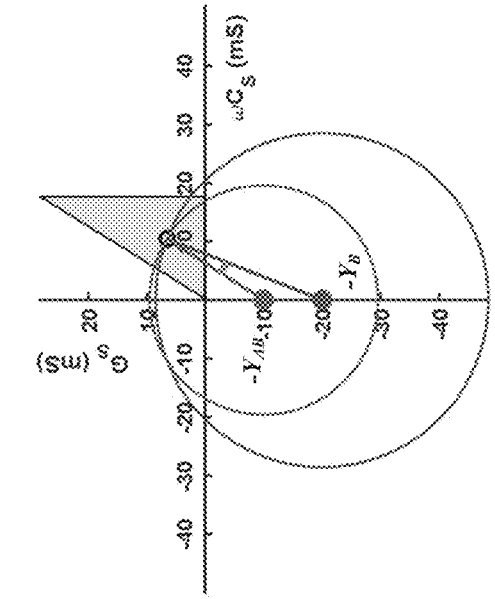
FIG. 13B is a plot of a complex admittance space showing example data based on the sensor of FIG. 13A.

Using embodiments of the present disclosure, a user or designer can evaluate the performance of different sensor configurations for a given sample (or a range of samples, as suggested by the triangular potential target admittance range in FIG. 13B), evaluate which configurations display poor sensitivity or increased error amplification, and design and implement an optimal complex dielectric sensor. The sensitivity of a given instrument depends on sample admittance, so when $Y_S$ ranges over different possible values, a compromise can be made so that sensitivity is satisfactory on average. A method of implementing a complex dielectric sensor instrument with high average sensitivity can include a step of defining a domain of possible values for $Y_S$. As an example, for soil, such domain can be represented by a generally triangular shape in the admittance space, as illustrated by the triangle in FIG. 13B. Sample capacitance can depend on water content, while conductance can depend on water salinity and water content. In the examples illustrated below, a range of sample materials is analyzed that have potential relative dielectric values between 1 and 81 and conductivity values within a range of about 0 to about 5 decisiemens per meter (dS/m), which are values rarely exceeded in soil. Also, in these example calculations, $C_0=0.5$ pF and excitation is 70 MHz. For other media (e.g. food), the expected range of permittivity and conductivity can be different, and practical considerations may impose different values for the geometric coefficient $C_0$ and frequency. As a result, a complex dielectric sensor optimized for measurements in one material (e.g., soil) may perform poorly in other materials (e.g., food) and vice versa. The criteria discussed below are general, nonetheless, and may be applied to a variety of porous media.

In order to quantify and compare sensitivities, the present examples of embodiments use an error in raw voltage amplitude measurements of dV=1 mV (which is a reasonable value for medium- to low-cost voltmeters). This gives rise to an error in gain ratios $g_{12}$ and $g_{02}$, which can be computed for the worst case scenario, whereby the numerator is overestimated by 1 mV and the denominator underestimated by the same amount, and vice versa. The resulting errors for dielectric and conductivity can then be calculated for each sample within the triangular domain. Indicating such errors respectively with $d\varepsilon$ and $d\sigma$, $$d\varepsilon = \lambda_\varepsilon dV \quad (12)$$

$$d\sigma = \lambda_\sigma dV \quad (13)$$

The coefficients $\lambda_\varepsilon$ and $\lambda_\sigma$ are amplification factors (reciprocal of sensitivity) respectively for $\varepsilon$ and $\sigma$. They represent the maximum possible error in dielectric and conductivity expected for a unit random error in amplitude measurements and can be expressed in units of 1/mV and dS/m/mV, respectively.

Figure 13C:
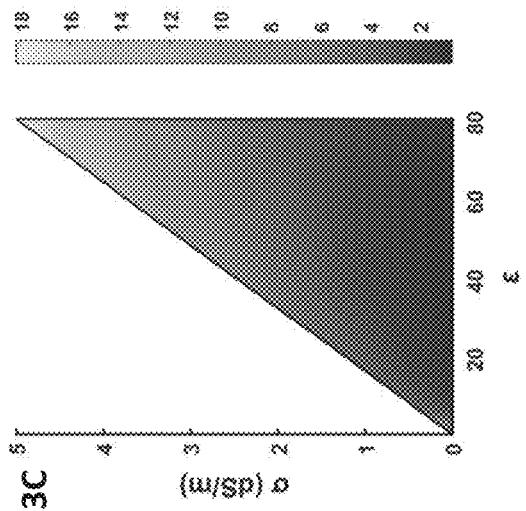
FIG. 13C is a heatmap of a range of dielectric error values of a sample material based on the sensor of FIG. 13A.
Figure 13D:
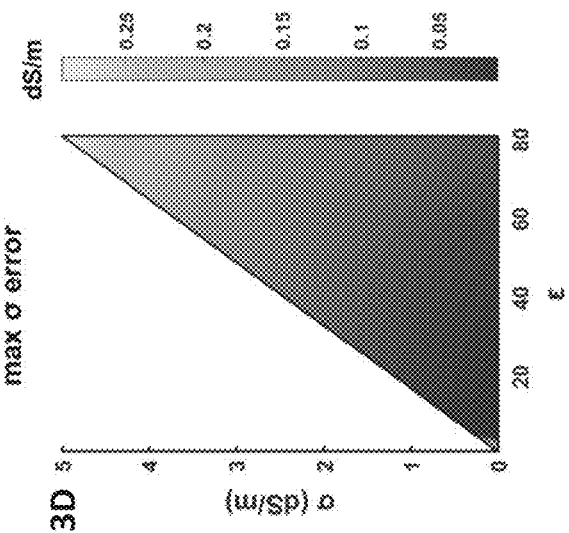
FIG. 13D is a heatmap of a range of conductivity error values of a sample material based on the sensor of FIG. 13A.
Figure 18A:
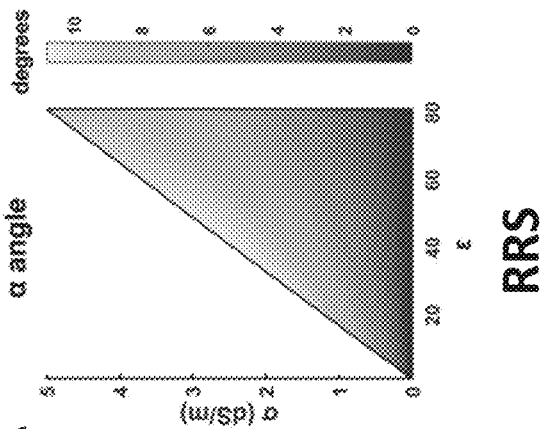
FIGS. 18A, 18B, 18C, 18D, and 18E are heatmaps of a range of characteristic direction angle values correlated to permittivity and conductivity of a sample material, with each heatmap being based on the sensors of FIGS. 13, 14, 15, 16, and 17, respectively.

In a resistor-resistor-sample (RRS) configuration, where two identical resistors are in series with the sample (see FIG. 13A), from equations (6) and (7), both centers $Y_{AB}$ and $Y_B$ are located on the vertical axis in the admittance space, as shown in FIG. 13B. In FIG. 13B, a hypothetical measurement $Y_S$ of a generic sample is shown within the triangular domain (indicated by the circular marker entirely within the triangular domain). For this and most other samples, the angle $\alpha$ is much smaller than 90 degrees, thus the two circles are nearly parallel at their intersection. Poor performance is therefore expected for this configuration. For very low dielectric and conductivity, the sample admittance nearly coincides with the axis' origin. In this case, $\alpha=0$ (i.e. the two centers and $Y_S$ are aligned), and accurate measurements are simply not possible. FIGS. 13C and 13D confirm this by showing simulation results with the maximum expected errors in $\varepsilon$ and $\sigma$ due to a 1 mV random error in amplitude measurements. FIG. 18A shows a map of angle $\alpha$ for the permittivity and conductivity of the sample when using the RRS circuit, and the angle ranges from 0 degrees to about 10 degrees, and specifically between 10 and 11 degrees. Input signal from the signal source is assumed 1 volt, so raw error is about 0.1% in this example. The resulting absolute errors predicted by the model are up to about 18 units for the dielectric value and a 0.28 dS/m for the conductivity value. See FIGS. 13C and 13D. These correspond to relative errors of about 25% for dielectric and just under about 10% for conductivity. These values are unacceptably high for most applications, indicating that this configuration is a poor choice for complex dielectric measurements. We remark that the performance of the RRS configuration, as well as the results above, strongly depend on the choice for the two resistors' values. We used in our calculations 50 ohm for both, as this seems to represent the most favorable scenario (i.e. with greatest accuracy on average) for such configuration.

Figure 14C:
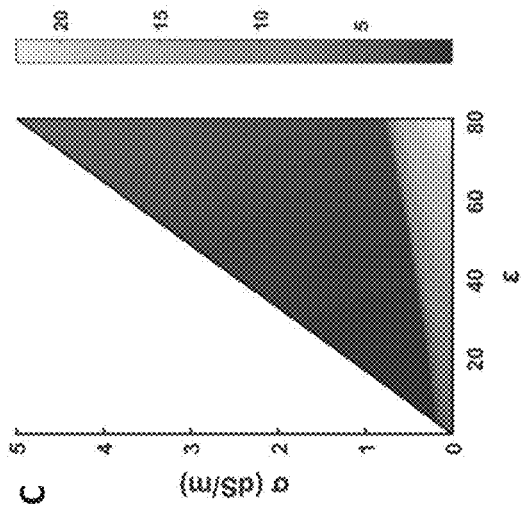
FIG. 14C is a heatmap of a range of dielectric error values of a sample material based on the sensor of FIG. 14A.
Figure 14D:
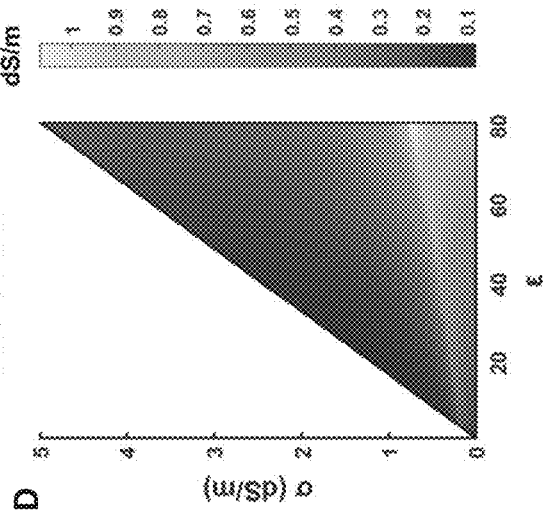
FIG. 14D is a heatmap of a range of conductivity error values of a sample material based on the sensor of FIG. 14A.
Figure 14A:
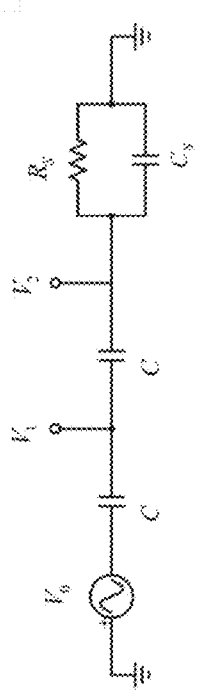
FIG. 14A is a circuit diagram of a sensor.
Figure 14B:
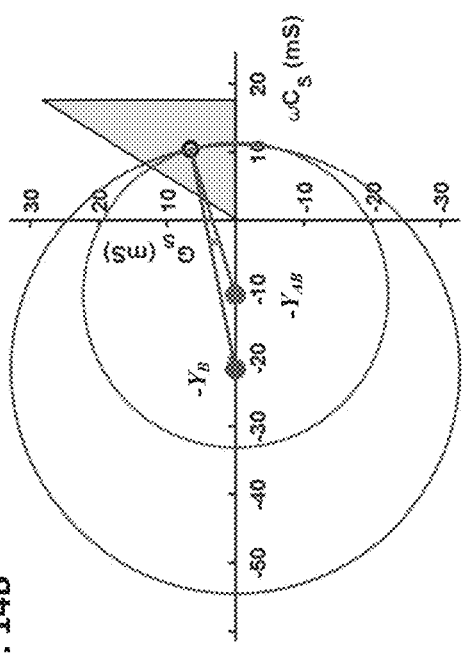
FIG. 14B is a plot of a complex admittance space showing example data based on the sensor of FIG. 14A.
Figure 18B:
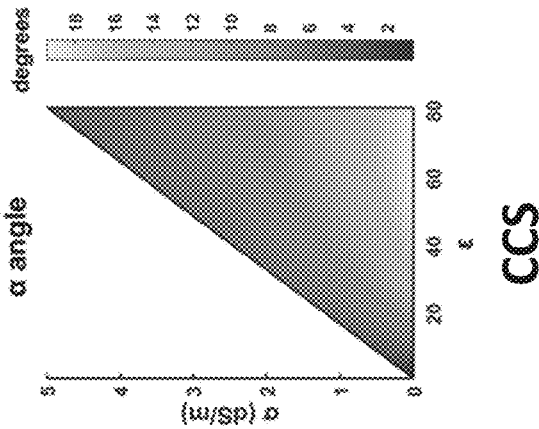

FIG. 14A shows another embodiment of a sensor using a capacitor-capacitor-sample (CCS) configuration. $Y_A$ and $Y_B$ are reactive, so both circle centers are on the horizontal axis, as shown in FIG. 14B. Even in this case the angle $\alpha$ is small, as shown in FIG. 14B and in the angle map of FIG. 18B, and it becomes zero for low conductivity samples. As a result, large dielectric permittivity and conductivity errors are expected for this configuration, as predicted by the two error maps of FIGS. 14C-D. Accuracy improves somewhat for high conductivity samples, with an angle $\alpha$ up to about 18 degrees, and between 18 and 19 degrees, as shown in FIG. 18B, but generally this design is less effective for low conductivity samples.

Figure 15C:
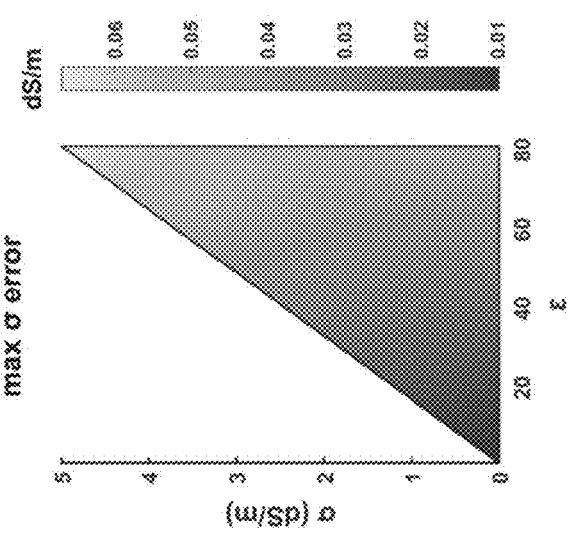
FIG. 15C is a heatmap of a range of dielectric error values of a sample material based on the sensor of FIG. 15A.
Figure 15D:
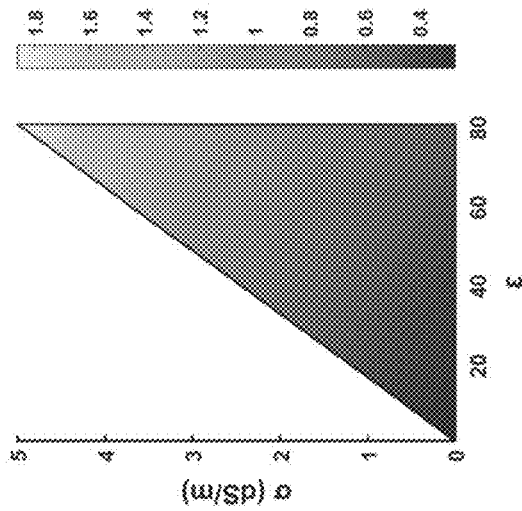
FIG. 15D is a heatmap of a range of conductivity error values of a sample material based on the sensor of FIG. 15A.
Figure 15A:
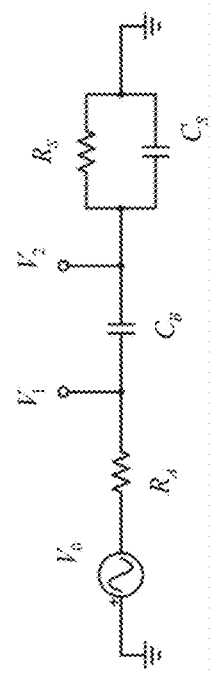
FIG. 15A is a circuit diagram of a sensor.
Figure 15B:
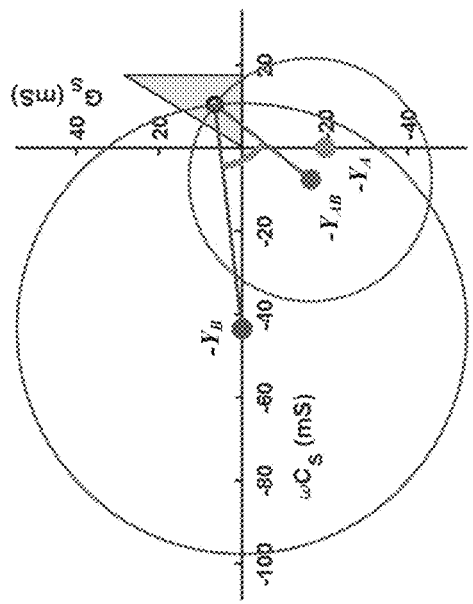
FIG. 15B is a plot of a complex admittance space showing example data based on the sensor of FIG. 15A.
Figure 18C:
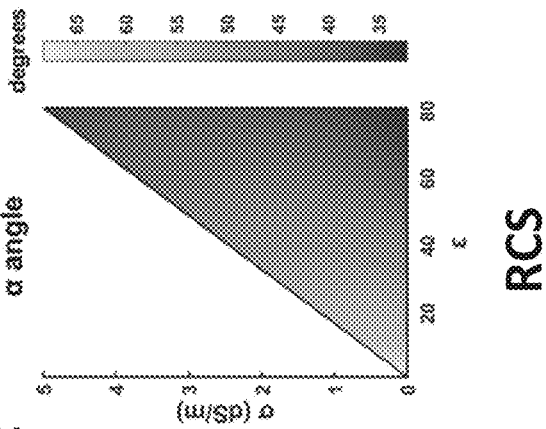

FIG. 15A shows another embodiment of a sensor having a resistor-capacitor-sample (RCS) configuration. Here, the angle $\alpha$ is larger than the preceding two examples, and much nearer to 90 degrees, resulting into much greater accuracy compared to the previous examples. The location of the two centers is such that no sample admittance exists within the triangular domain that may align with the two centers. In other words, the angle $\alpha$ will always be greater than zero, such as, for example, within a range of about 30 degrees to about 70 degrees, as shown in the angle map of FIG. 18C. Performance is therefore improved throughout the sample domain relative to the RRS and CCS configurations.

The maximum relative error is again observed for high conductivity samples, and is contained to about 4% and about 1%, respectively, for $\varepsilon$ and $\sigma$. See FIGS. 15C and 15D. As discussed above, these are errors caused by a 1 mV random error in voltage amplitude measurements. The maximum absolute error is far less for the RCS configuration as compared to the RRS configuration, as shown in FIGS. 15C and 15D, wherein the maximum error in dielectric is about 1.8 (10 times smaller than the maximum error observed with RRS configuration) per millivolt of raw voltmeter error, and the maximum error in conductivity is about 0.07 dS/m (about four times smaller than the corresponding error for RRS) per millivolt of raw voltmeter error. Accordingly, embodiments of the present disclosure enable the construction and use of a complex dielectric sensor far more sensitive than the RRS device, with error in dielectric value being less than 18 per millivolt of raw voltmeter error and less than 0.25 dS/m per millivolt of raw voltmeter error. As illustrated in FIG. 15, embodiments of the present disclosure can attain an absolute error for dielectric and conductivity less than about 15 and about 0.20 dS/m, respectively, per millivolt of raw error. In some embodiments, the absolute error values can be less than about 2 and about 0.1 dS/m, respectively, per millivolt of raw error. In some embodiments, the absolute error values can be less than about 0.5 and about 0.05 dS/m, respectively, per millivolt of raw error, as shown in FIG. 17.

Figure 16A:
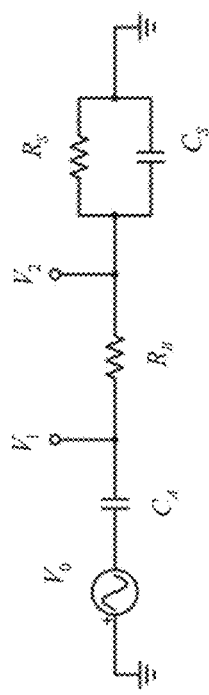
FIG. 16A is a circuit diagram of a sensor.
Figure 16C:
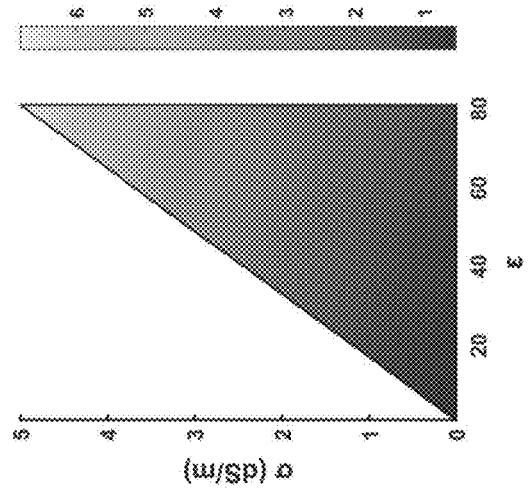
FIG. 16C is a heatmap of a range of dielectric error values of a sample material based on the sensor of FIG. 16A.
Figure 16B:
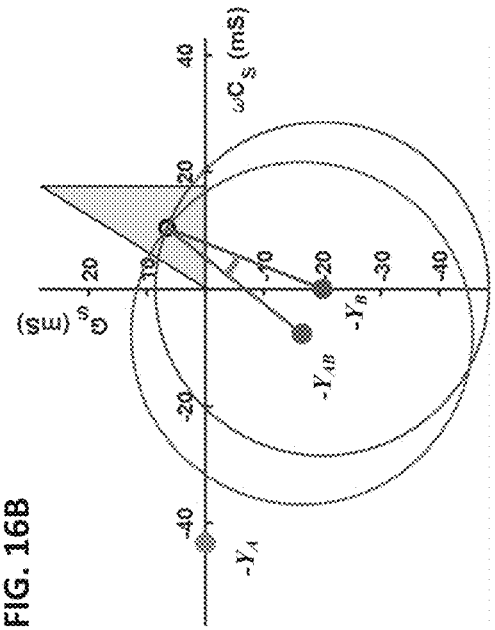
FIG. 16B is a plot of a complex admittance space showing example data based on the sensor of FIG. 16A.
Figure 16D:
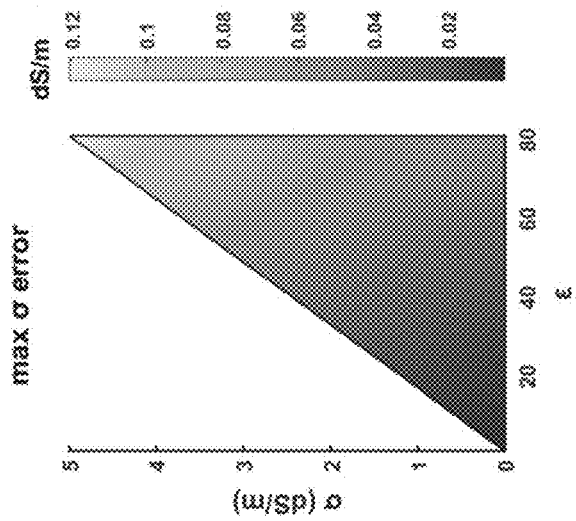
FIG. 16D is a heatmap of a range of conductivity error values of a sample material based on the sensor of FIG. 16A.
Figure 17A:
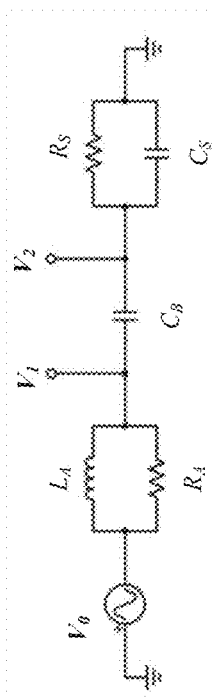
FIG. 17A is a circuit diagram of a sensor.
Figure 17B:
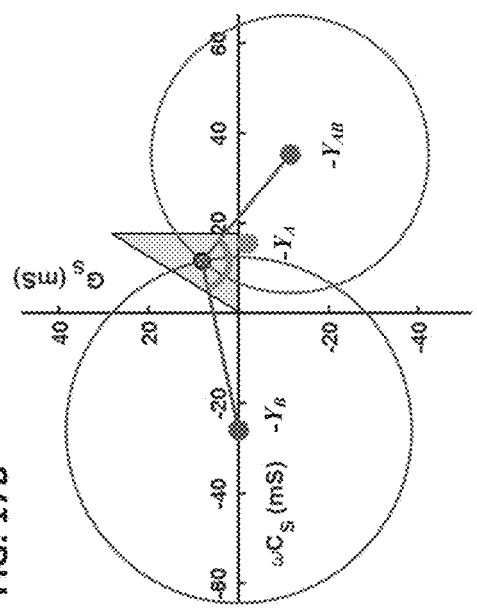
FIG. 17B is a plot of a complex admittance space showing example data based on the sensor of FIG. 17A.
Figure 17C:
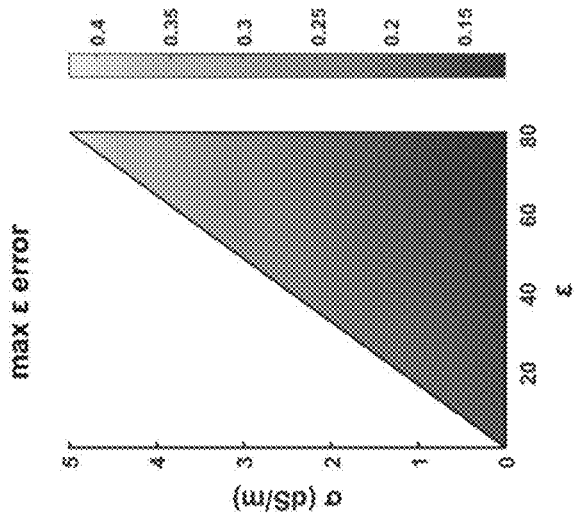
FIG. 17C is a heatmap of a range of dielectric error values of a sample material based on the sensor of FIG. 17A.
Figure 17D:
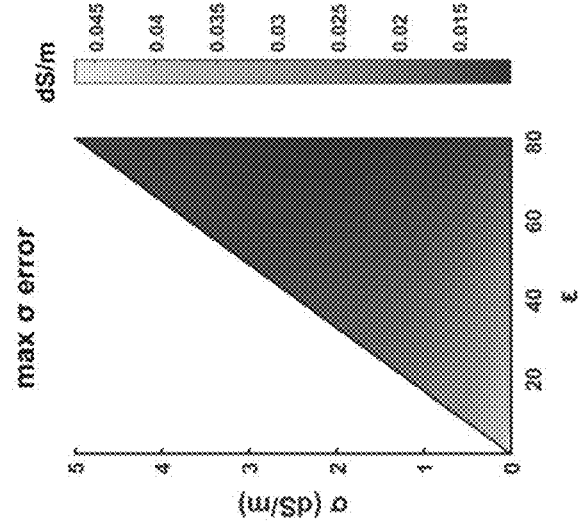
FIG. 17D is a heatmap of a range of conductivity error values of a sample material based on the sensor of FIG. 17A.
Figure 18D:
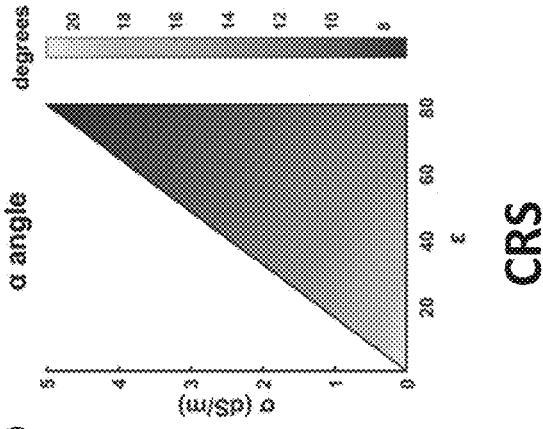

The circuit in FIG. 16A is similar to the embodiment of FIG. 15A but has reversed positions for the resistor $R_B$ and capacitor $C_A$ as compared to FIG. 15A. The two centers of the mapped circles $Y_{AB}$ and $Y_B$ in the complex plane are now much closer and the angle α is much smaller. See FIG. 16B. This example demonstrates that in some cases, merely including both resistance and reactance in the circuit does not guarantee sufficient sensitivity. The mere presence of both resistance and reactance is not necessary to attain good accuracy, as FIG. 12 indicates, nor is it sufficient, as shown in FIG. 16. Furthermore, merely substituting a capacitor for one of the resistors of the RRS circuit does not guarantee effectiveness of a complex dielectric sensor. Instead, the angle between the characteristic directions, along with the distance of the centers from the origin, determines the sensitivity of a dual voltage divider device. As shown in FIG. 18D, the angle α map ranges from about 8 to about 20 degrees for the CRS configuration, and this range is further from the 90-degree preferred angle than the RCS configuration of FIG. 18C.

Figure 18E:
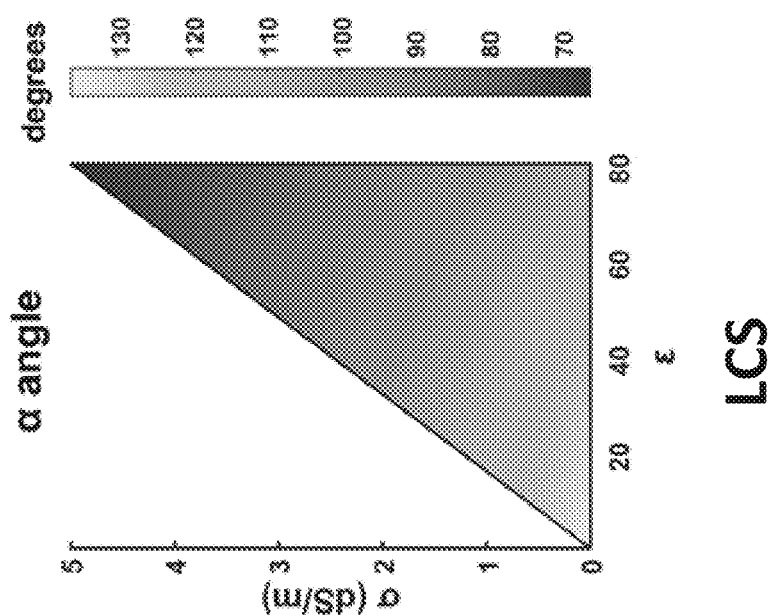

The embodiment of FIG. 17 shows how criteria of the present disclosure can help optimize the design of a complex dielectric sensor, especially when measuring high-conductivity samples. Simple geometrical considerations suggest that adequate distances and angles can be attained by locating the two centers on opposite sides of the sample triangle. This can be done by introducing an inductance $L_A$ in $Y_A$, so that $-Y_{AB}(O_{2O})$ can be on the $\omega C_S > 0$ space, as done in the ideal configuration displayed in FIG. 12A. However, merely including an inductance $L_A$ as part of the first impedance would not work well for low conductivity samples (i.e., α would approach π), so a resistance $R_A$ can be included in parallel with $L_A$ in order to bring the center $-Y_{AB}$ below the horizontal axis, as shown in FIG. 17B, and unlike FIG. 12B. This provision results in the best performance for the investigated sample domain, with relative errors in dielectric as small as about 0.5% and less than about 1% for conductivity. See FIGS. 17C and 17D. The angle α for all permittivity and conductivity values also lies within the range of about 70 degrees to about 135 degrees, as shown in FIG. 18E. This range includes and is roughly centered near 90 degrees, and much nearer to 90 degrees than the embodiments of FIGS. 18A-18D, thereby ensuring high sensitivity for all complex dielectric measurements and illustrating an optimized circuit design. This accuracy is well within the values expected from a scientific instrument, thereby making the instrument more desirable for most applications.

The examples described herein illustrate how the performance of a dual voltage divider can vary dramatically depending on configuration and component values. Sufficient accuracy can be attained by implementing the methods disclosed herein and following the criteria suggested by the geometrical analysis.

What is claimed is:

1. A complex dielectric sensor for porous media, the sensor comprising:
   a voltage source to output a source signal having a source frequency and a source amplitude;
   at least two electrodes insertable into a sample medium;
   a first reference impedance electrically connected between the signal source and the at least two electrodes;
   a second reference impedance electrically connected between the signal source and the at least two electrodes;
   a first junction located between the first reference impedance and the second reference impedance;
   a second junction located between the second reference impedance and at least one electrode of the at least two electrodes; and
   a sensor device configured to measure a first amplitude of a first signal at the first junction, a second amplitude of a second signal at the second junction, and the source amplitude between the signal source and the first reference impedance while the source frequency is output by the voltage source through the first and second reference impedances;
   wherein at least one of the first and second reference impedances comprises a reactive circuit element; and
   wherein the sensor device is configured to calculate a complex admittance of the sample based on the first amplitude, the second amplitude, and the source amplitude.

2. The complex dielectric sensor of claim 1, wherein the first reference impedance comprises a capacitor and the second reference impedance comprises a resistor or an inductor.

3. The complex dielectric sensor of claim 1, wherein the first reference impedance comprises a resistor and the second reference impedance comprises a capacitor or an inductor.

4. The complex dielectric sensor of claim 1, wherein the first reference impedance comprises an inductor and the second reference impedance comprises a resistor or a capacitor.

5. The complex dielectric sensor of claim 1, wherein the signal source, the first reference impedance, the second reference impedance, and the electrodes form a three-wire half bridge configuration.

6. The complex dielectric sensor of claim 1, wherein the sensor device is configured to calculate:
   a first gain ratio of the second amplitude to the first amplitude; and
   a second gain ratio of the second amplitude to the source amplitude.

7. The complex dielectric sensor of claim 1, wherein the first amplitude, the second amplitude, and the source amplitude are all configured to be simultaneously measured at a single value of the source frequency.

8. A complex dielectric sensor, comprising:
   a voltage source to output a source signal having a source voltage amplitude;
   at least two electrodes insertable into a sample medium;
   a first reference impedance electrically connected between the voltage source and the at least two electrodes;

a second reference impedance electrically connected between the voltage source and the at least two electrodes; and a sensor device configured to:
  measure a first voltage amplitude across the first reference impedance,
  measure a second voltage amplitude across the second reference impedance; and
  calculate a complex admittance of the sample medium based on the first voltage amplitude across the first reference impedance, the second voltage amplitude across the second reference impedance, and the source voltage amplitude;

wherein at least one of the first and second reference impedances comprises a reactive circuit element.

9. The complex dielectric sensor of claim 8, wherein:
the first and second reference impedances are arranged in series;
the voltage source is electrically connected to the first reference impedance to form a junction at which the source voltage amplitude ($V_0$) is measured;
the first reference impedance is electrically connected to the second reference impedance to form a junction at which the first voltage amplitude ($V_1$) is measured;
the second reference impedance is electrically connected to at least one of the at least two electrodes to form a junction at which the second voltage amplitude ($V_2$) is measured; and
estimating the complex admittance of the sample medium comprises:
  determining a first voltage ratio ($g_A$) based on the second voltage amplitude and the source voltage amplitude;
  determining a second voltage ratio ($g_B$) based on the second voltage amplitude and the first voltage amplitude; and
  calculating the complex admittance of the sample medium ($Y_s$) using the first voltage ratio and the second voltage ratio.

10. The complex dielectric sensor of claim 9, wherein, when the sensor device is calculating the complex admittance of the sample medium:
the first voltage ratio ($g_A$)=$V_2/V_0$;
the second voltage ratio ($g_B$)=$V_2/V_1$; and
the complex admittance of the sample medium ($Y_s$) is calculated by solving the following system of equations:

$$\left|\frac{Y_{AB}}{Y_{AB}+Y_S}\right| = g_A; \text{ and}$$

$$\left|\frac{Y_B}{Y_{B+Y_S}}\right| = g_B;$$

wherein $Y_B$ is a complex admittance of the second reference impedance and $Y_{AB}$ is a complex admittance of the series combination of the first and second reference impedances.

11. The complex dielectric sensor of claim 8, further comprising:
a switch operable between:
  a first state enabling a connection between the voltage source and at least one of the at least two electrodes via the first reference impedance; and
  a second state enabling a connection between the voltage source and at least one of the at least two electrodes via the second reference impedance; and
wherein:
  the first and second reference impedances are arranged in parallel;
  the source is electrically connected to the first and second reference impedances to form a first junction at which the source voltage amplitude ($V_0$) is measurable;
  the switch is connected to at the at least one of the at least two electrodes to form a junction at which:
    the first voltage amplitude ($V_1$) is measurable when the switch is in the first state; and
    the second voltage amplitude ($V_2$) is measurable when the switch is in the second state; and
  estimating the complex admittance of the sample medium comprises:
    determining a first voltage ratio ($g_A$) based on the first voltage amplitude and the source voltage amplitude;
    determining a second voltage ratio ($g_B$) based on the second voltage amplitude and the source voltage amplitude; and
    calculating the complex admittance of the sample medium ($Y_s$) using the first voltage ratio and the second voltage ratio.

12. The complex dielectric sensor of claim 11, wherein when estimating the complex admittance of the sample medium:
the first voltage ratio ($g_A$)=$V_1/V_0$;
the second voltage ratio ($g_B$)=$V_2/V_0$; and
the complex admittance of the sample medium ($Y_s$) is calculated by solving the following system of equations:

$$\left|\frac{Y_A}{Y_A+Y_S}\right| = g_A; \text{ and}$$

$$\left|\frac{Y_B}{Y_{B+Y_S}}\right| = g_B;$$

wherein $Y_A$ is a complex admittance of the first reference impedance and $Y_B$ is a complex admittance of the second reference impedance.

* * * * *